(12) United States Patent
Nagamori et al.

(10) Patent No.: US 6,958,649 B2
(45) Date of Patent: Oct. 25, 2005

(54) HIGH-FREQUENCY POWER AMPLIFICATION ELECTRONIC PART AND WIRELESS COMMUNICATION SYSTEM

(75) Inventors: Hiroyuki Nagamori, Komoro (JP); Takayuki Tsutsui, Saku (JP); Kouichi Matsushita, Karuizawa (JP)

(73) Assignees: Renesas Technology Corp, Tokyo (JP); Hitachi Hybrid Network, Co., Ltd., Kanagawa (JP)

( * ) Notice: Subject to any disclaimer, the term of this patent is extended or adjusted under 35 U.S.C. 154(b) by 0 days.

(21) Appl. No.: 11/097,271

(22) Filed: Apr. 4, 2005

(65) Prior Publication Data

US 2005/0168281 A1   Aug. 4, 2005

Related U.S. Application Data

(63) Continuation of application No. 10/682,193, filed on Oct. 10, 2003.

(30) Foreign Application Priority Data

Nov. 7, 2002 (JP) .............................. 2002-323333

(51) Int. Cl.[7] .............................................. H03G 5/16
(52) U.S. Cl. ...................... 330/133; 330/285; 330/289
(58) Field of Search ............................... 330/133, 285, 330/289, 310

(56) References Cited

U.S. PATENT DOCUMENTS

| | | | |
|---|---|---|---|
| 5,160,898 A | * | 11/1992 | Black ........................ 330/284 |
| 5,204,637 A | | 4/1993 | Trinh |
| 5,774,017 A | | 6/1998 | Adar |
| 6,008,698 A | | 12/1999 | Dacus et al. |
| 6,194,968 B1 | | 2/2001 | Winslow |
| 6,329,879 B1 | * | 12/2001 | Maruyama et al. ......... 330/289 |
| 6,492,869 B1 | * | 12/2002 | Kuriyama ................... 330/133 |
| 6,825,725 B1 | * | 11/2004 | Doherty et al. ............. 330/289 |
| 2001/0040481 A1 | | 11/2001 | Ueno et al. |

FOREIGN PATENT DOCUMENTS

| | | |
|---|---|---|
| JP | 2000-151310 | 5/2000 |
| JP | 2001-320242 | 11/2001 |

* cited by examiner

*Primary Examiner*—Patricia Nguyen
(74) *Attorney, Agent, or Firm*—Mattingly, Stanger, Malur & Brundidge, P.C.

(57) ABSTRACT

A high-frequency power amplification electronic part is disclosed which comprises a power amplifier circuit and a bias control circuit, the power amplifier circuit having a plurality of amplifier stages for amplifying an input high-frequency signal, the bias control circuit acting to bias the power amplifier circuit. The power amplifier circuit controls output power in accordance with input power that is varied while a gain of the power amplifier circuit is being fixed by either a bias current or a bias voltage supplied from the bias control circuit. The bias control circuit supplies at least two diode characteristic elements with a predetermined current each in order to generate at least two voltages demonstrating different temperature characteristics, the bias control circuit further using the generated voltages as a basis for generating either a plurality of bias currents or a plurality of bias voltages having a desired temperature-dependent rate of change each, the generated bias currents or bias voltages being fed to each of the plural amplifier stages constituting the power amplifier circuit.

9 Claims, 8 Drawing Sheets

HIGH-FREQUENCY POWER AMPLIFICATION ELECTRONIC PART AND WIRELESS COMMUNICATION SYSTEM

This is a continuation application of U.S. Ser. No. 10/682,193 filed Oct. 10, 2003, which has been abandoned.

BACKGROUND OF THE INVENTION

The present invention relates to a high-frequency power amplifier circuit which is used by a wireless communication system such as mobile telephones and which amplifies a high-frequency signal before outputting the amplified signal, and to an electronic part incorporating such a high-frequency power amplifier circuit. More particularly, the invention relates to a wireless communication system for varying input power of a high-frequency power amplifier circuit in order to control output power of the circuit, the output power being controlled while the gain of the high-frequency power amplifier circuit is being kept constant regardless of temperature variations.

There has been in use a wireless communication system (mobile communication apparatus) such as a mobile telephone operating on a principle called GSM (Global System for Mobile Communication) that utilizes a frequency band of 880 through 915 MHz. GSM is based on a phase modulation method called GMSK (Gaussian Minimum Shift Keying) whereby the phase of a carrier is shifted in keeping with transmitted data. In recent years, a new mobile telephone that works in at least two modes has been proposed. The proposed telephone causes voice to be modulated by GMSK for communication while allowing data to be modulated by EDGE (Enhanced Data Rates for GMS Evolution) for communication, the latter method supplementing the phase-shifting GMSK method with amplitude shifting capabilities.

A transmission output block of the wireless communication system (mobile communication apparatus) such as the mobile telephone incorporates a high-frequency power amplifier circuit (called the power amplifier circuit hereunder) for amplifying a modified signal. In conventional wireless communication systems, the gain of the power amplifier circuit is controlled in accordance with the level of transmission requests coming from a base band circuit or from a control circuit such as a micro-processor. The control is accomplished by detecting the output level of the power amplifier circuit or an antenna and by feeding what is detected back to the amplifier circuit so as to vary a bias voltage or a bias current of the circuit, whereby the gain of the power amplifier circuit is controlled. This scheme is disclosed illustratively in Japanese Published Unexamined Patent Application No. 2000-151310.

SUMMARY OF THE INVENTION

The above-outlined gain control of the power amplifier circuit is common to communication systems that operate in the GMSK modulation mode. On the other hand, some communication systems having the EDGE mode adopt a control method that controls output power by varying input power while keeping the gain of the power amplifier constant.

Where that control method is in use, noise can become greater at higher temperatures as the gain of the power amplifier circuit is varied with temperature. If the gain of the power amplifier circuit is reduced so as to suppress noise, the gain can become too low—and power inordinately reduced—at lower temperatures. For these reasons, a temperature compensation circuit is needed by the setup in which the output power of the power amplifier circuit is controlled by varying its input power; the temperature compensation circuit serves to keep the gain of the power amplifier circuit constant regardless of temperature variations.

A typical temperature compensation circuit works as follows: where an input Pin of a power amplifier PA and a drain current Id of a power amplification transistor TR therein are kept constant in an equivalent circuit of the power amplifier PA shown in FIG. 11, the gain of the amplifier PA drops if left unattended as the temperature rises. The temperature-induced drop in the gain is prevented by supplying the power amplifier PA with a gate bias voltage Vgg in such a manner that the drain current Id increases linearly in proportion to the rising temperature, as illustrated in FIG. 12.

To implement such temperature compensation requires installing a temperature detection circuit that detects temperature variations. One conventional temperature detection circuit is based on a temperature-dependent diode characteristic, i.e., the circuit takes advantage of the fact that the forward voltage of diodes changes with temperature variations. However, the temperature compensation circuit utilizing the temperature-dependent diode characteristic has its own share of disadvantage: variations in detection output between diodes due to unsteady manufacturing procedures can cause the temperature compensation circuit to become unstable in controlling the gain. This can make it difficult to achieve temperature compensation with stability and precision.

It is therefore an object of the present invention to overcome the above and other deficiencies of the related art and to provide a high-frequency power amplification electronic part comprising a bias control circuit as well as a wireless communication system utilizing that high-frequency power amplification electronic part, the bias control circuit biasing a power amplifier circuit arranged to control its output power in keeping with changes in its input power, the bias control circuit further comprising a temperature compensation feature whereby the gain of the power amplifier circuit is kept constant regardless of temperature variations and free from variations in characteristics between circuit elements due to unsteady manufacturing procedures.

It is another object of the present invention to provide a high-frequency power amplification electronic part comprising a bias control circuit which has a temperature compensation feature and which is capable of operating at low voltages, as well as a wireless communication system employing that high-frequency power amplification electronic part.

It is a further object of the present invention to provide a high-frequency power amplification electronic part comprising a bias control circuit as well as a wireless communication system using that high-frequency power amplification electronic part, the bias control circuit being capable of generating a plurality of bias currents or bias voltages that may be supplied to each of multiple amplifier stages constituting a power amplifier circuit having a temperature compensation feature or a multi-band power amplifier circuit.

In achieving the foregoing and other objects of the present invention and according to one aspect thereof, there is provided a high-frequency power amplification electronic part comprising a power amplifier circuit and a bias control circuit. The power amplifier circuit is arranged to control output power in accordance with input power that is varied while a gain of the power amplifier circuit is being fixed by a bias current or a bias voltage supplied from the bias control circuit. The bias control circuit supplies at least two diode characteristic elements with a predetermined current each in order to generate two voltages demonstrating different temperature characteristics expressed by a linear function (y= ax+b) each. The bias control circuit further utilizes the generated voltages as a basis for generating a plurality of bias currents or bias voltages having a suitable temperature-dependent rate of change or gradient (coefficient "a" in the linear function above) each, the generated bias currents or bias voltages being fed to each of the plural amplifier stages constituting the power amplifier circuit. Preferably, the voltage or current corresponding to the constant "b" in the linear function representing the bias current or bias voltage above may be adjusted by use of a temperature-independent reference voltage.

The above-outlined high-frequency power amplification electronic part of the invention generates bias currents or bias voltages each having a specific temperature characteristic, and supplies the generated currents or voltages to the multiple amplifier stages making up the power amplifier circuit in keeping with the characteristic of each of the power amplification transistors constituting the amplifier stages. The scheme makes it possible to keep the gain of the power amplifier circuit constant regardless of temperature variations.

DETAILED DESCRIPTION OF THE PREFERRED EMBODIMENTS

Preferred embodiments of this invention will now be described with reference to the accompanying drawings.

Figure 1:
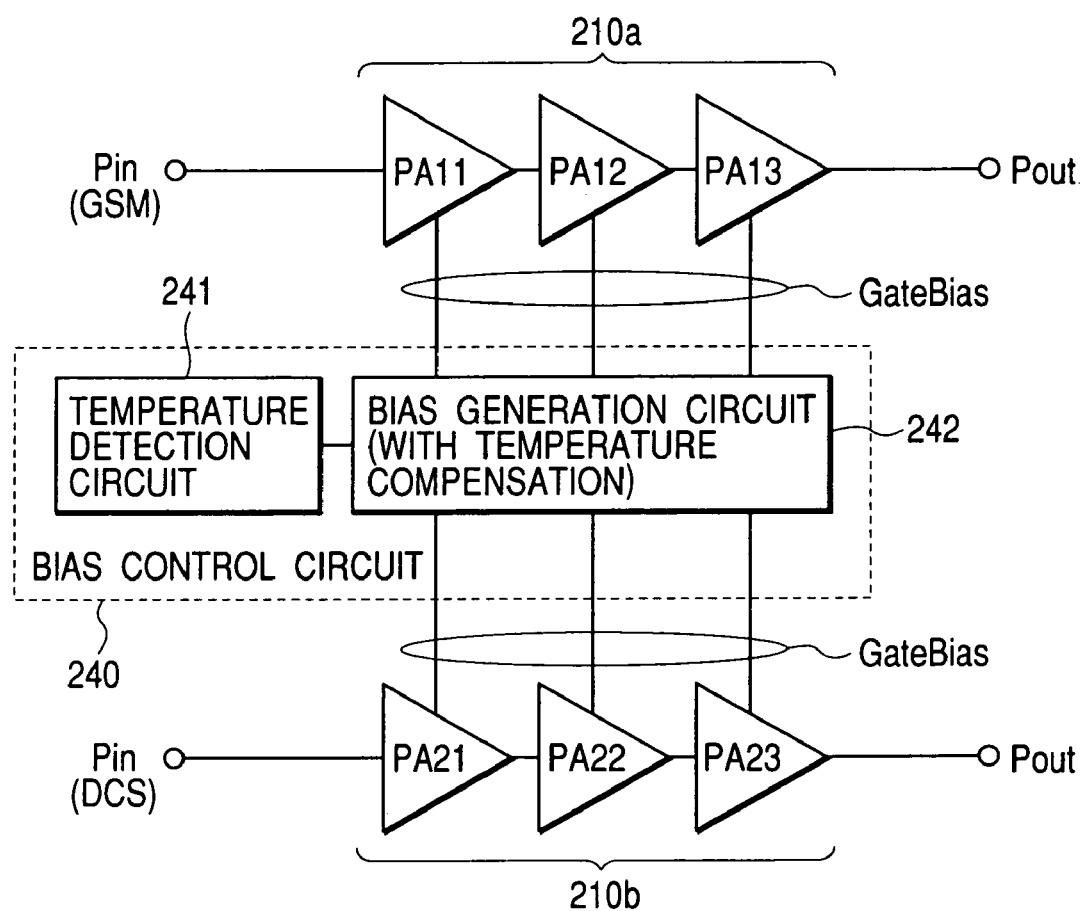
FIG. 1 is a block diagram outlining a typical structure of a high-frequency power amplifier block of a wireless communication system embodying the invention.

FIG. 1 is a block diagram outlining a typical structure of a high-frequency power amplifier block of a wireless communication system embodying the invention. This embodiment is structured as, but not limited to, a dual-band communication system using GSM and DCS. FIG. 1 shows two power amplifier circuits making up the system and a bias control circuit serving to bias these amplifier circuits.

In FIG. 1, reference numeral 210a stands for a power amplifier circuit that amplifies an outgoing signal at 900 MHz on the GSM frequency band; 210b denotes a power amplifier circuit that amplifies an outgoing signal at 1,800 MHz on the DSC frequency band; and 240 represents a bias control circuit that generates bias currents to be fed to the power amplifier circuits 210a and 210b.

The power amplifier circuits 210a and 210b are each constituted by three amplifier stages, PA11 through PA13 and PA21 through PA23 respectively, each stage being illustratively formed by an FET (field effect transistor). The bias control circuit 240 is made of a temperature detection circuit 241 and a bias generation circuit 242. The two circuits 241 and 242 combine to generate temperature-compensated bias currents that are supplied to the amplifier stages PA11 through PA13 and PA21 through PA23.

Figure 2:
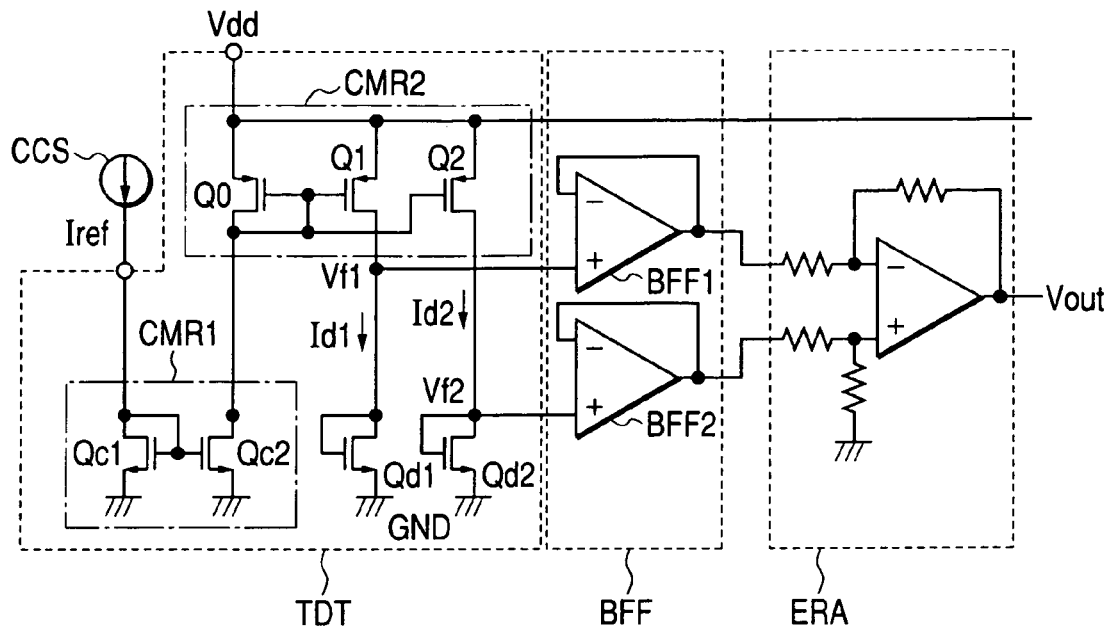
FIG. 2 is a circuit diagram of a typical temperature detection circuit.

FIG. 2 is a circuit diagram of a typical temperature detection circuit 241. This circuit 241 is made up of a temperature detection block TDT, a buffer block BFF, and an error amplifier circuit ERA. The temperature detection block TDT comprises: a first current mirror circuit CMR1 which is made of a pair of MOSFETs Qc1 and Qc2 with their gates connected in common and which mirrors a reference current Iref coming from a constant current source CCS; a second current mirror circuit CMR2 which further mirrors the mirrored current supplied by the first current mirror circuit CMR1; and MOSFETs Qd1 and Qd2 connected in series to mirror-destination MOSFETs Q1 and Q2 constituting part of the second current mirror circuit CMR2. The buffer block BFF includes buffers BFF1 and BFF2 which convert drain voltages Vf1 and Vf2 of the MOSFETs Qd1 and Qd2 in impedance respectively before outputting the converted voltages. The output voltages from the buffers BFF1 and BFF2 are input to the error amplifier circuit ERA. In turn, the error amplifier circuit ERA outputs a voltage proportional to a potential difference between the drain voltages Vf1 and Vf2 of the MOSFETs Qd1 and Qd2.

A mirror-source MOSFET Q0 and the mirror-destination MOSFET Q1 partially making up the second current mirror circuit CMR2 are arranged so that their gate widths have a ratio of 1 to N (N>1), and the MOSFETs Q0 and Q2 are formed so that their gate widths have ratio of 1 to 1. The MOSFETs Q0 and Q2 are formed to have the same gate length. The arrangements cause the MOSFET Q1 to be fed with a current Id1 that is N times a current Id2 of the MOSFET Q2. The MOSFETs Qd1 and Qd2 have their gates and drains connected so that they function as diodes having the same size and the same characteristics.

When a supply voltage Vdd is provided in such a manner as to have drain currents fed to the MOSFETs Qd1 and Qd2, the drain current characteristic in the saturation region of the MOSFETs dictates that a relationship expressed by the equation $$Id = (\beta/2) \cdot (Vf - Vth)^2 \tag{1}$$

be established between the current Id flowing through the transistors Qd1 and Qd2 on the one hand, and the voltage Vf (=gate-to-source voltage) generated between the drain and the source on the other hand.

Figure 3:
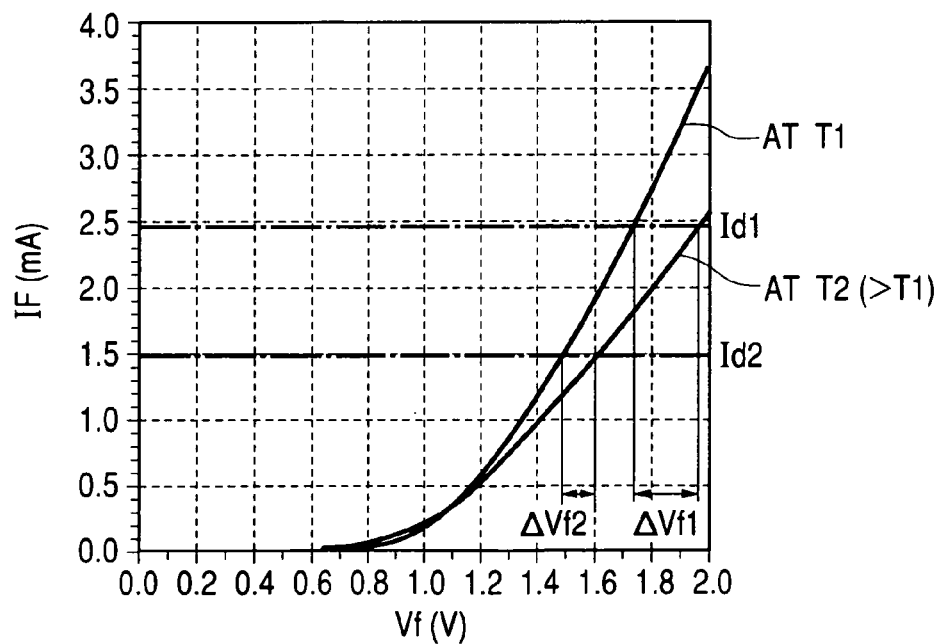
FIG. 3 is a graphic representation indicating a voltage versus current characteristic of a diode-connected MOSFET arrangement in a temperature detection circuit of the embodiment.
Figure 4:
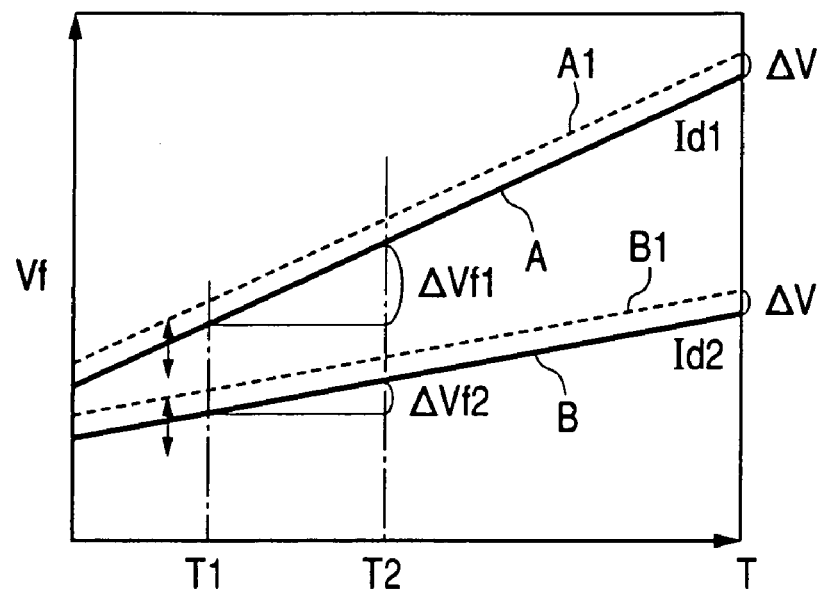
FIG. 4 is a graphic representation illustrating a temperature characteristic of an output voltage from the temperature detection circuit of the embodiment.

In the equation (1) above, reference character β denotes a coefficient having a negative temperature characteristic, and Vth represents a threshold voltage of an MOSFET having a negative temperature characteristic. FIG. 3 graphically shows typical relations between the source-to-drain voltage Vf and the current Id of MOSFETs at temperatures T1 and T2 (T2>T1). FIG. 4 illustrates graphically how the drain-to-source voltages Vf1 and Vf2 of the MOSFETs Qd1 and Qd2 vary with temperature T. As can be seen in FIG. 4, the drain-to-source voltage Vf1 of the MOSFET Qd1 supplied with the larger current Id1 varies more prominently than the drain-to-source voltage Vf2 of the MOSFET Qd2 fed with the smaller current Id2.

In the circuit of FIG. 2, the current supplied to the MOSFETs Qd1 and Qd2 from the current mirror circuit CMR2 remains constant regardless of temperature variations. Suppose that the current Id1 fed to the MOSFET Qd1 is 2.5 mA and the current Id2 supplied to the MOSFET Qd2 is 1.5 mA. In that case, as shown in FIG. 3, the drain-to-source voltage Vf1 of the MOSFET Qd1 varies by ΔVf1 and the drain-to-source voltage Vf2 of the MOSFET Qd2 by ΔVf2 when the temperature changes from T1 to T2.

FIG. 3 reveals that the variation is smaller in the voltage ΔVf2 than in the voltage ΔVf1. As the drain-to-source voltages Vf1 and Vf2 of the MOSFETs Qd1 and Qd2 are fed to the error amplifier circuit ERA through the buffers BFF1 and BFF2, the error amplifier circuit ERA amplifies the potential difference between Vf1 and Vf2 in order to output a voltage Vout. The lower the temperature, the lower the output voltage Vout, and vice versa.

Figure 5:
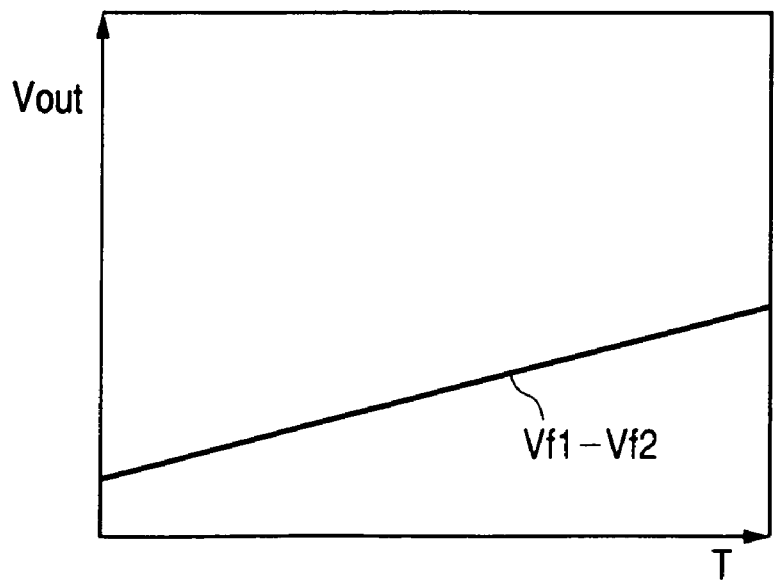
FIG. 5 is a graphic representation depicting a temperature characteristic of an output voltage from an error amplifier circuit of the embodiment.

In the circuit of FIG. 2, the MOSFETs Qd1 and Qd2 have the same size and the same characteristic. If the MOSFET Qd1 has a variation in its characteristic due to unstable manufacturing procedures, the MOSFET Qd2 is likely to have a similar variation in its characteristic as well. For example, if a variation in threshold voltage of the MOSFET Qd1 causes the temperature characteristic A of the drain-to-source voltage Vf1 to shift by ΔV as indicated by a broken line A1, the temperature characteristic B of the drain-to-source voltage Vf2 of the MOSFET Qd2 varies likewise by ΔV as shown by a broken line B1. In the temperature detection circuit of FIG. 2, the voltages thus varied are fed to the error amplifier circuit ERA as in-phase components. This cancels out the variations, with the result that the output voltage is free of variations as shown in FIG. 5.

The above-described workings may be explained using expressions as shown below. In view of the expression (1) discussed earlier, the drain-to-source voltages Vf1 and Vf2 of the MOSFETs Qd1 and Qd2 are expressed as follows:

$$Vf1=\sqrt{(2 \cdot Id1/\beta)}+Vth$$

$$Vf2=\sqrt{(2 \cdot Id2/\beta)}+Vth$$

It follows that $Vf1-Vf2=\sqrt{2} \cdot (\sqrt{Id1}-\sqrt{Id2})/\sqrt{\beta}$, which shows "Vf1−Vf2" to be independent of the threshold voltage Vth. The currents Id1 and Id2 supplied by the current mirror circuit CMR2 are temperature-independent currents, and the coefficient β has a negative temperature characteristic as mentioned above. Therefore an upward-sloping linear curve graphically represents "Vf1−Vf2" as illustrated in FIG. 5.

The temperature detection circuit of FIG. 2 has a two-stage structure in which the MOSFETs Q1 and Q2 constituting the current mirror circuit and the diode-connected MOSFETs Qd1 and Qd2 are connected in series between a supply voltage terminal Vdd and a ground GND. That means the temperature detection circuit of FIG. 2 can operate on a lower voltage than its three-stage structure counterpart. Because of today's intense demands for the wireless communication system such as mobile telephones to consume as little power as possible, the component circuits of the system are being constantly improved to operate on lower voltages. Under the circumstances, the temperature detection circuit such as the one above operating at a low voltage is used very effectively in such a wireless communication system.

The constant current source CCS generating a constant current regardless of temperature variations is implemented using a known constant current circuit that provides temperature compensation by combining a positive temperature characteristic element with a negative temperature characteristic element. Such a temperature-independent constant current circuit readily generates a reference current Iref fit for the temperature detection circuit 241 of this embodiment. Illustratively, the constant current circuit and the inventive temperature detection circuit may be formed on a single semiconductor chip.

This embodiment has its MOSFETs Qd1 and Qd2 formed to have the same size and the same characteristic, with any variations in their characteristic canceled out by the downstream amplifiers. The same effects can be obtained by replacing the MOSFETs Qd1 and Qd2 with PN junction diodes or with bipolar transistors with their bases and collectors connected. In this specification, the PN junction diodes, the MOSFETs with their gates and drains connected, and the bipolar transistors with their bases and collector connected are each called a diode characteristic element.

Figure 6:
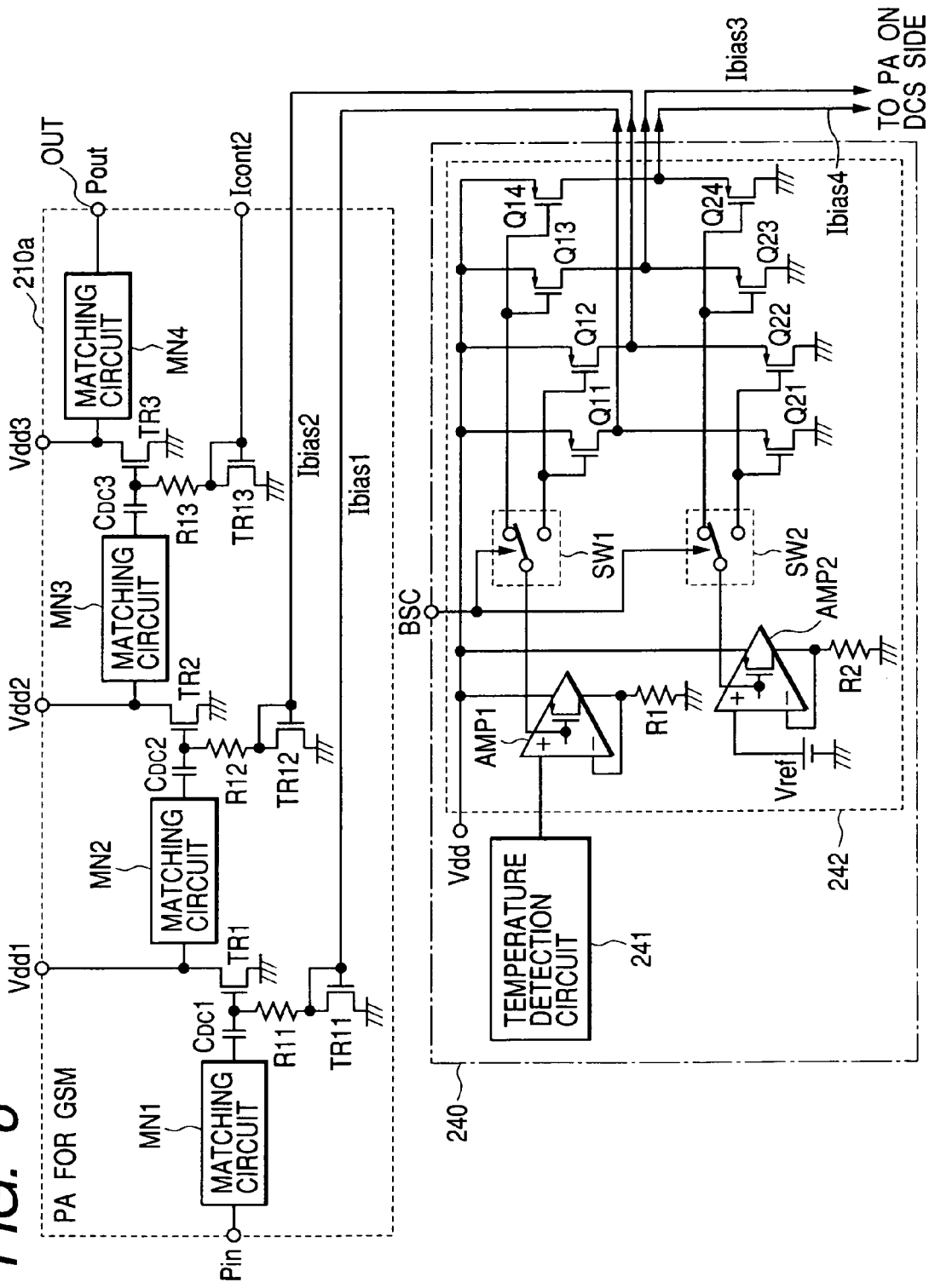
FIG. 6 is a circuit diagram of a typical power amplifier circuit and a typical bias generation circuit.

Described below with reference to FIG. 6 are a typical power amplifier circuit 210a, one of the two amplifier circuits in FIG. 1, and a typical bias generation circuit 242 for GSM. The power amplifier circuit 210a in FIG. 6 comprises: a first-stage power amplification transistor TR1 illustratively made of an MOSFET for amplifying a high-frequency signal Pin input through an impedance matching circuit MN1 and a DC-blocking capacitative element CDC1; a second-stage power amplification transistor TR2 for receiving the output of the transistor TR1 through an impedance matching circuit MN2 and a capacitative element CDC2 and amplifying the received output; a third-stage power amplification transistor TR3 for receiving the output of the transistor TR2 through an impedance matching circuit MN3 and a capacitative element CDC3 and amplifying the received output; an impedance matching circuit MN4 connected interposingly between the drain of the transistor TR3 and an output terminal OUT; resistors R1$i$ (i=1, 2, 3) connected in series between the gates of the power amplification transistors TR1 through TR3 on the one hand, and the ground on the other hand; and bias transistors TR1$i$.

The bias transistors TR1$i$ (i=1, 2, 3) have their gates and drains connected. The drains are fed with bias currents Ibias1 and Ibias2 from the bias generation circuit 242 as well as with a bias current Icont2 from outside the chip. The power amplifier circuit 210b has the same structure, not shown.

In the example of FIG. 2, the power amplification transistors TR1 through TR3 are shown implemented using an MOSFET each. Alternatively, bipolar transistors, GaAs-MESFETs, hetero junction bipolar transistors (HBTs), or HEMTs (high electron mobility transistors) may be utilized instead.

The bias generation circuit 242 comprises: a voltage-to-current conversion amplifier circuit AMP1 that receives the output voltage of the temperature detection circuit 241 and outputs a current derived from the received voltage; a voltage-to-current conversion amplifier circuit AMP2 that receives the reference voltage Vref and outputs a current derived from the received voltage; MOSFETs Q11 through Q14 connected to the output MOSFET of the amplifier circuit AMP1 for current mirroring purposes; MOSFETs Q21 through Q24 connected to the output MOSFET of the amplifier circuit AMP2 for current mirroring purposes; a changeover switch SW1 interposed between the gate of the output MOSFET in the amplifier circuit AMP1 on the one hand and the gates of the MOSFETs Q11 through Q14 on the other hand; and a changeover switch SW2 interposed between the gate of the output MOSFET in the amplifier circuit AMP2 on the one hand and the gates of the MOSFETs Q21 through Q24 on the other hand. The current mirroring MOSFET Q11 is connected in series to the MOSFET Q21, the MOSFET Q12 to the MOSFET Q22, the MOSFET Q13 to the MOSFET Q23, and the MOSFET Q14 to the MOSFET Q24.

When a band selection signal BSC is supplied by an outside circuit, not shown, to designate GSM transmission mode, the changeover switches SW1 and SW2 operate to connect the gate input of the output MOSFET in the amplifier circuit AMP1 to the gates of the current mirroring MOSFETs Q11 and Q12, and to connect the gate input of the output MOSFET in the amplifier circuit AMP2 to the gates of the current mirroring MOSFETs Q21 and Q22. When the band selection signal BSC specifies DCS transmission mode, the changeover switches SW1 and SW2 serve to connect the gate input of the output MOSFET in the amplifier circuit AMP1 to the gates of the current mirroring MOSFETs Q13 and Q14, and to connect the gate input of the output MOSFET in the amplifier circuit AMP2 to the gates of the current mirroring MOSFETs Q23 and Q24.

In GSM transmission mode, the currents obtained by subtracting the drain currents of the MOSFETs Q21 and Q22 from the drain currents of the MOSFETs Q11 and Q12 are supplied as the bias currents Ibias1 and Ibias2 to the bias transistors TR11 and TR12 of the power amplifier circuit 210a, whereby the gates of the power amplification transistors TR1 and TR2 are suitably biased. In DCS transmission mode, the currents obtained by subtracting the drain currents of the MOSFETs Q23 and Q24 from the drain currents of the MOSFETs Q13 and Q14 are fed as the bias currents Ibias3 and Ibias4 to the power amplifier circuit 210b for suitable biasing action.

It is conceivable that the bias control circuit 240 generates voltages Vdd1 through Vdd3 to be fed to the drains of the transistors TR1 through TR3 in the amplifier stages of the power amplifier circuits 210a and 210b. However, this embodiment is arranged to apply battery voltages directly to the drains of the power amplification transistors TR1 through TR3.

Figure 7:
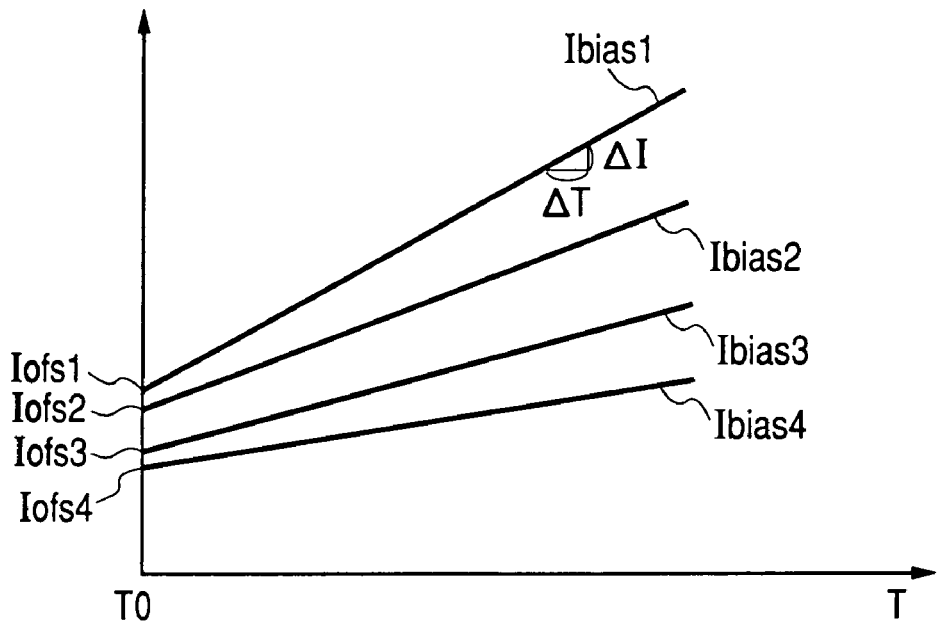
FIG. 7 is a graphic representation of a temperature characteristic of a bias current output by a bias generation circuit of the embodiment.

In keeping with the workings of the power amplifier circuits 210a and 210b, the bias generation circuit 242 of FIG. 6 permits suitable setting of two kinds of variables: the resistance value of the resistor R1 connected serially to the output MOSFET of the voltage-to-current conversion amplifier circuit AMP1, and the size ratio (i.e., ratio of gate widths; this applies hereunder) of the output MOSFET in the amplifier circuit AMP1 to each of the current mirroring MOSFETs Q11 through Q14. The settings make it possible to vary suitably temperature characteristic gradients $\Delta I/\Delta T$ (equivalent to the coefficient "a" in the linear function $y=ax+b$) of the bias currents Ibias1 through Ibias4, as shown in FIG. 7. More specifically, varying the resistance value of the resistor R1 varies all temperature characteristic gradients $\Delta I/\Delta T$ of the bias currents Ibias1 through Ibias4 by the same degree. On the other hand, making the size ratios of the output MOSFET in the amplifier circuit AMP1 to the current mirroring MOSFETs Q11 through Q14 different from one another renders the temperature characteristic gradients $\Delta I/\Delta T$ of the bias currents Ibias1 through Ibias4 different from one another.

Furthermore, in keeping with the workings of the power amplifier circuits 210a and 210b, the bias generation circuit 242 of FIG. 6 permits suitable setting of another two kinds of variables: the resistance value of the resistor R2 connected serially to the output MOSFET of the amplifier circuit AMP2 for converting the reference voltage Vref into a current, and the size ratio of the output MOSFET in the amplifier circuit AMP2 to each of the current mirroring MOSFETs Q21 through Q24. The settings make it possible to establish as desired the currents Iofs1 through Iofs4 (called the offset currents in this specification) for the bias currents Ibias1 through Ibias4 (see FIG. 7) in effect at a reference temperature T0. To be more specific, varying the resistance value of the resistor R2 varies all offset currents Iofs1 through Iofs4 for the bias currents Ibias1 through Ibias4 by the same degree. On the other hand, making the size ratios of the output MOSFET in the amplifier circuit AMP2 to the current mirroring MOSFETs Q21 through Q24 different from one another renders the offset currents Iofs1 through Iofs4 for the bias currents Ibias1 through Ibias4 different from one another.

With the above arrangements in place, it is possible to generate four bias currents Ibias1 through Ibias4 each having a different temperature characteristic gradient $\Delta I/\Delta T$ and a different offset current Iofs. If the power amplifier circuits 210a and 210b have a different bias condition each, and if the amplification transistors TR1 and TR2 in the first and the second stages of the two amplifier circuits have a different gain temperature characteristic each, it is still possible to generate and supply the optimum bias currents Ibias1 through Ibias4 for the amplification transistors TR1 and TR2 in the different stages. When the bias currents Ibias1 through Ibias4 with their temperature characteristics thus established are fed to the bias transistors TR1 and TR12 in the first and the second stages, the drains of the two transistors develop voltages that are supplied to the gates of the amplification transistors TR1 and TR2. This makes it possible for the wireless communication system to control output power by varying input power in such a manner as to keep the gain of the power amplifier circuits 210a and 210b constant regardless of temperature variations.

Furthermore, the bias generation circuit 242 of FIG. 6 can raise the number of bias currents it generates by simply increasing the number of MOSFETs connected to the output MOSFETs of the amplifier circuits AMP1 and AMP2 for current mirroring purposes. The structure makes it possible to generate a plurality of types of bias currents needed by multi-stage power amplifiers and multiple-band systems such as those of the invention. Where there is a need for a growing number of bias currents, any increase in the scale of circuitry for the system as a whole can still be kept minimal with the above structure.

In the embodiment of FIG. 6, the amplification transistor TR3 in the last stage of the power amplifier circuits 210a and 210b has its gate bias voltage generated using a bias transistor TR3 and a bias resistor R13 based on a temperature-uncompensated current Icont2 from an outside circuit such as a base band circuit.

The arrangement above is conceived for the following reasons: the inventive power amplifier circuits 210a and 210b are designed to have most of their necessary gains achieved by the first-stage and second-stage power amplification transistors TR1 and TR2, with the last-stage transistor TR3 providing a gain of nearly "1" to let a large current flow, whereby the required output power is furnished. Such a low-gain transistor manifests few variations in terms of output power even though the gate voltage of the transistor is more or less temperature dependent. In addition, the last-stage transistor TR3 has such a small amplitude of input voltages that little benefit is derived from supplying a temperature-compensated bias voltage to the gate of the transistor. Thus there is no specific need for temperature compensation.

In the inventive system, its output power is controlled by varying its input power while the power amplifier bias is being kept constant. In that structure, if the bias generation circuit 242 were to supply a bias current to the third-stage transistor TR3 as well, a relatively large amount of drain current would flow uselessly through the transistor TR3 while the output poser is low. By comparison, if the last-stage transistor TR3 is arranged to be fed with the gate bias voltage from an outside circuit as described above, the drain current of the transistor TR3 is reduced while the output power is low, whereby the current consumption of the system as a whole is decreased.

It is not mandatory, however, that the gate bias current to the last-stage transistor TR3 in the power amplifier circuits 210a and 210b be supplied from an outside circuit and not generated by the bias generation circuit 242 in the example of FIG. 6. It is possible to install another two MOSFETs in parallel with the current mirroring MOSFETs Q11 through Q14 as well as Q21 through Q24, the two additional MOSFETs having their gates connected in common with the gates of the output MOSFETs of the two amplifier circuits AMP1 and AMP2. In this setup, the two MOSFETs may generate a gate bias current and supply it to the last-stage transistor TR3.

In the embodiment of FIG. 6, the bias generation circuit 242 generates the gate bias current and feeds it to the power amplifier circuits 210a and 210b. Alternatively, it is possible to eliminate the transistors TR11 through TR13 and resistors R11 through R13, install current-to-voltage conversion resistors on the side of the bias control circuit 240, and let the gate bias current generated by the bias generation circuit 242 flow through the current-to-voltage conversion resistors for conversion into voltages which may be fed, in place of currents, to the gates of the amplification transistors TR1 through TR3. It might happen that the bias generation circuit 242 is formed on a semiconductor chip separate from another chip accommodating the amplification transistors TR1 through TR3 constituting the power amplifier circuits 210a and 210b. In that case, more accurate control is accomplished if the bias transistors TR11 through TR13 connected to the amplification transistors TR1 through TR3 for current mirroring purposes are formed on the same chip as TR1 through TR3 whereas the bias generation circuit 242 on a different chip generates the gate bias current and supplies it to the resistors R11 through R13 for conversion into bias voltage, whereby the gates of the amplification transistors TR1 through TR3 are biased.

Such control is made possible with high precision for the following reasons: if the amplification transistors TR1 through TR3 and the bias transistors TR1 through TR13 are formed on the same chip and if these transistors are connected so as to constitute a current mirror circuit, then any variations in the gate bias voltage of the amplification transistors TR1 through TR3 are minimized. That is because if the amplification transistors TR1 through TR3 possess characteristic deviations stemming from manufacturing processes, then the bias transistors TR11 through TR13 exhibit like characteristic deviations in the same direction.

Figure 8:
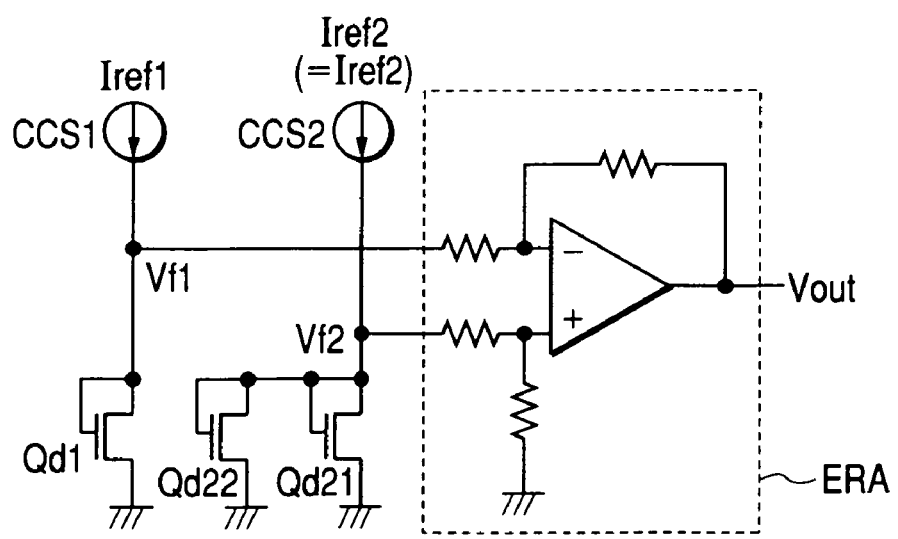
FIG. 8 is a circuit diagram of another typical temperature detection circuit.

FIG. 8 is a circuit diagram of another typical temperature detection circuit 241 of this invention. In this embodiment, the MOSFETs Q1 and Q2 making up the current mirror circuit CMR2 in the temperature detection circuit of FIG. 2 are represented by constant current sources CCS1 and CCS2 respectively. As in the setup of FIG. 6, the constant current sources CCS1 and CCS2 are constituted by a first and a second current mirror circuit CMR1 and CMR2 respectively, the first current mirror circuit CMR1 being made of MOSFETs Qc1 and Qc2, the second current mirror circuit CMR2 being composed of MOSFETs Q0, Q1 and Q2.

The inventive temperature detection circuit of FIG. 8 is so arranged that the constant current sources CCS1 and CCS2 provide currents Iref1 and Iref2 of the same amount (i.e., Iref1=Iref2). In this setup, the MOSFET Qd2 in the temperature detection circuit of FIG. 2 is replaced by two MOSFETs Qd21 and Qd22 each having the same size and the same characteristics as those of the MOSFET Qd1. The MOSFETs Qd21 and Qd22 have their gates and drains connected to form a diode connection arrangement, and have their drains commonly connected to the shared constant current source CCS2. In this embodiment, the current flowing through each of the MOSFETs Qd21 and Qd22 is half the current Iref2 furnished by the constant current source CCS2. The setup is a variation of the temperature detection circuit in FIG. 2 provided the gate width of the MOSFET Q1 is made twice that of the MOSFET Q2 in the current mirror circuit CMR2 so that Id1=2·Id2.

The MOSFETs Qd21, Qd22 and Qd1 have the same size and the same characteristics each. That means if the MOSFET Qd1 has deviations in such characteristics as the threshold voltage stemming from unstable manufacturing procedures, then the MOSFETs Qd21 and Qd22 possess similar characteristic deviations. That is, the MOSFETs Qd21 and Qd22 have the same deviations in their drain voltage Vf1 as those of the MOSFET Qd1 in its drain voltage Vf2. As a result, if the constant currents Iref1 and Iref2 are kept constant regardless of temperature variations, then the error amplifier circuit ERA outputs the voltage Vout having the desired temperature characteristic shown in FIG. 5 for the same reasons discussed above in connection with the temperature detection circuit of FIG. 2.

In the embodiment above of FIG. 8, the two MOSFETs having the same size and the same characteristics as those of the MOSFET Qd1 were shown replacing the MOSFET Qd2 in FIG. 2. However, this is not limitative of the invention. Alternatively, the number of parallelly connected MOSFETs can be three or more. The larger the number of parallelly connected MOSFETs, the steeper the gradient of the linear curve in FIG. 5. As another alternative, the MOSFET Qd1 getting the current Iref1 from the constant current source CCS1 may be replaced by two or more parallelly connected MOSFETs. It should be noted that the number (n) of Qd1's must not be equal to the number (m) of Qd2's. The Qd1-to-Qd2 current ratio is then set to "m:n."

In the embodiment of FIG. 8, the buffers BFF1 and BFF2 shown in FIG. 2 are absent, so that the drain voltage Vf1 of the MOSFET Qd1 and the drain voltage Vf2 of the MOSFETs Qd21 and Qd22 are input directly to the error amplifier circuit ERA. Alternatively, the drain voltages may be input to the error amplifier circuit ERA through the buffers BFF1 and BFF2 as in the setup of FIG. 2. Installing the buffers BFF1 and BFF2 prevents part of the currents Iref1 and Iref2, supplied by the constant current sources CCS1 and CCS2, from flowing to the input terminal of the error amplifier circuit ERA and causing the drain voltages Vf1 and Vf2 to deviate. That is, the buffers BFF1 and BFF2 help to generate more accurate bias currents to be fed to the power amplifier circuits.

Figure 9:
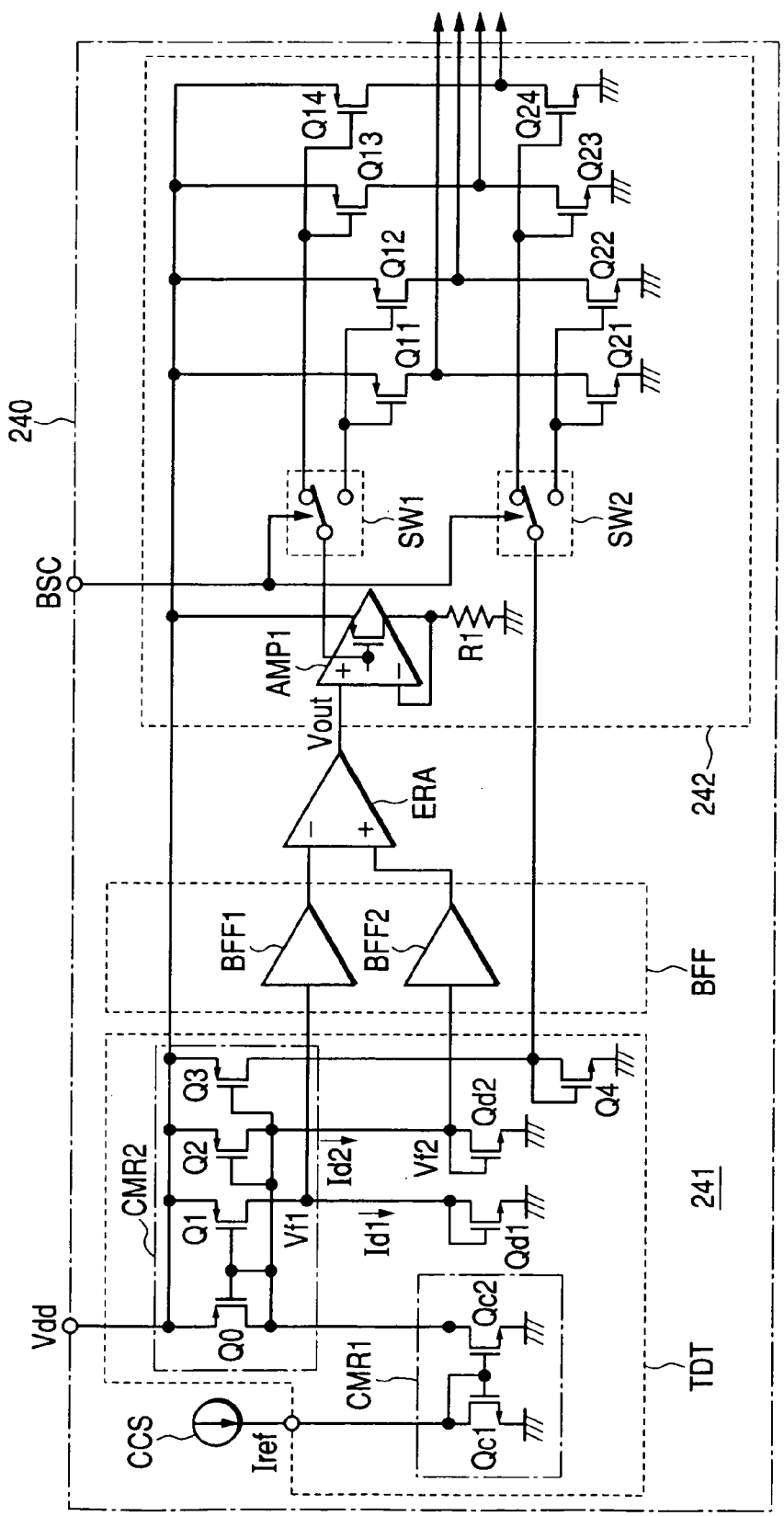
FIG. 9 is a circuit diagram of another typical bias generation circuit.

FIG. 9 is a circuit diagram of another typical bias generation circuit 242. In this embodiment of the bias generation circuit 242, the amplifier circuit AMP2 in FIG. 6 for converting the reference voltage Vref to currents is eliminated. A bias circuit is provided instead, constituted by P-channel MOSFETs Q0 and Q3 which have their gates connected in common and which make up the current mirror circuit CMR2 in the temperature detection circuit 241, and by an N-channel MOSFET Q4 connected in series to the MOSFET Q3. The MOSFET Q4 is connected in turn to the MOSFETs Q21 through Q24 on the current reducing side so as to draw in currents for current mirroring purposes. In other words, the embodiment of FIG. 9 is designed to generate the reference voltage Vref internally.

The MOSFETs Q21 through Q24 on the current reducing side in FIG. 6 are P-channel MOSFETs, whereas the MOSFETs Q21 through Q24 on the current reducing side in FIG. 9 are N-channel MOSFETs. That is due to differences in reference voltage levels in use.

In the embodiment of FIG. 9, the output bias currents Ibias1 through Ibias4 may also be offset as desired by suitably forming the sizes of the MOSFETs Q4 and Q21 through Q24. Furthermore, the chip size may be reduced because there is no need for the amplifier circuit AMP2 for converting the reference voltage Vref to currents. It should be noted, however, that in the embodiment of FIG. 6 the bias currents Ibias1 through Ibias4 may be offset depending on the system or the product of interest by furnishing the IC with an externally attached resistor R2 connected in series to the output MOSFET of the amplifier circuit AMP2. This arrangement allows the embodiment of FIG. 6 to be adjusted more easily and to function with higher accuracy than the embodiment of FIG. 9.

Figure 10:
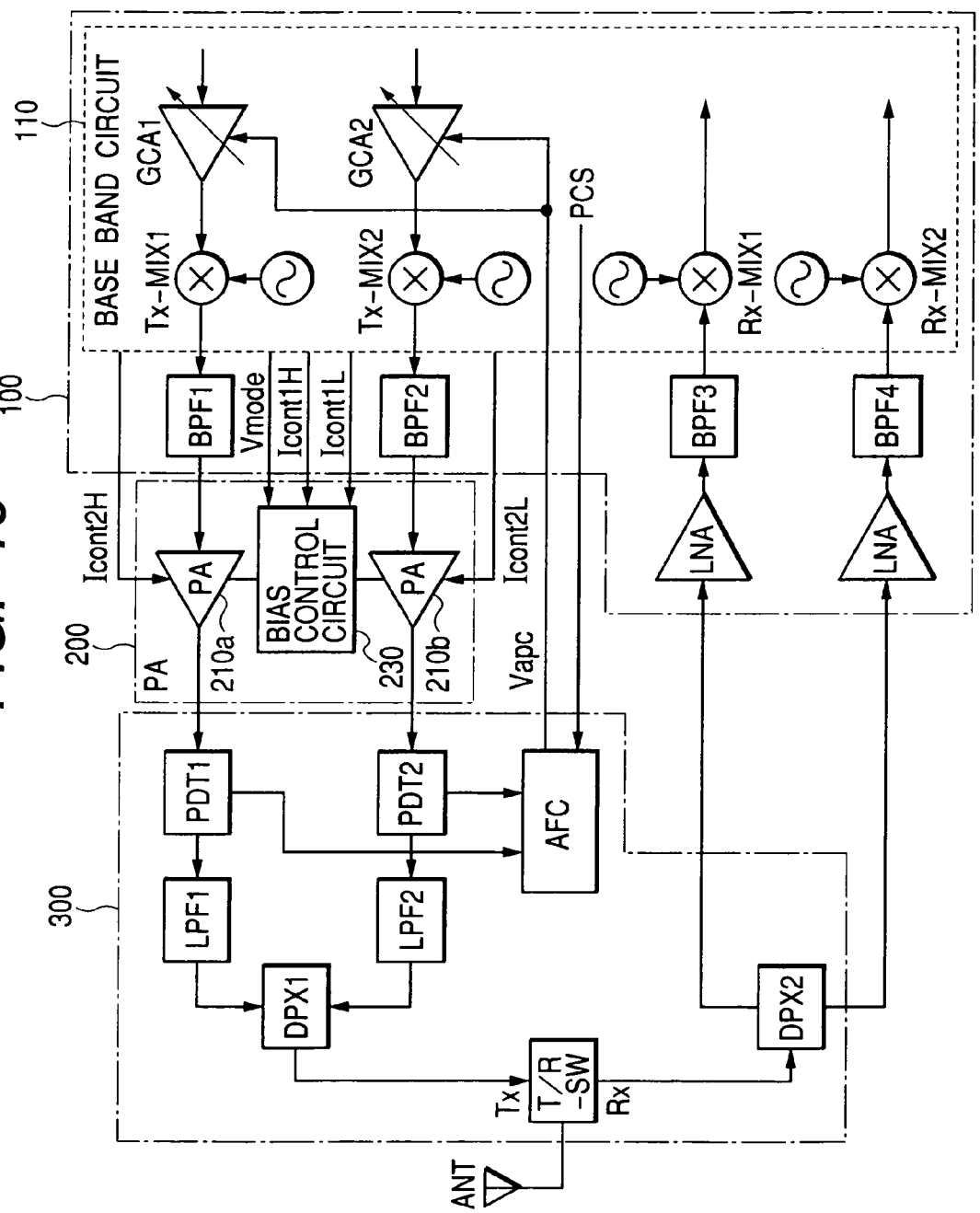
FIG. 10 is a block diagram outlining a wireless communication system embodying the invention, the system being capable of wireless communication using two bands, GSM and DCS.
Figure 11:
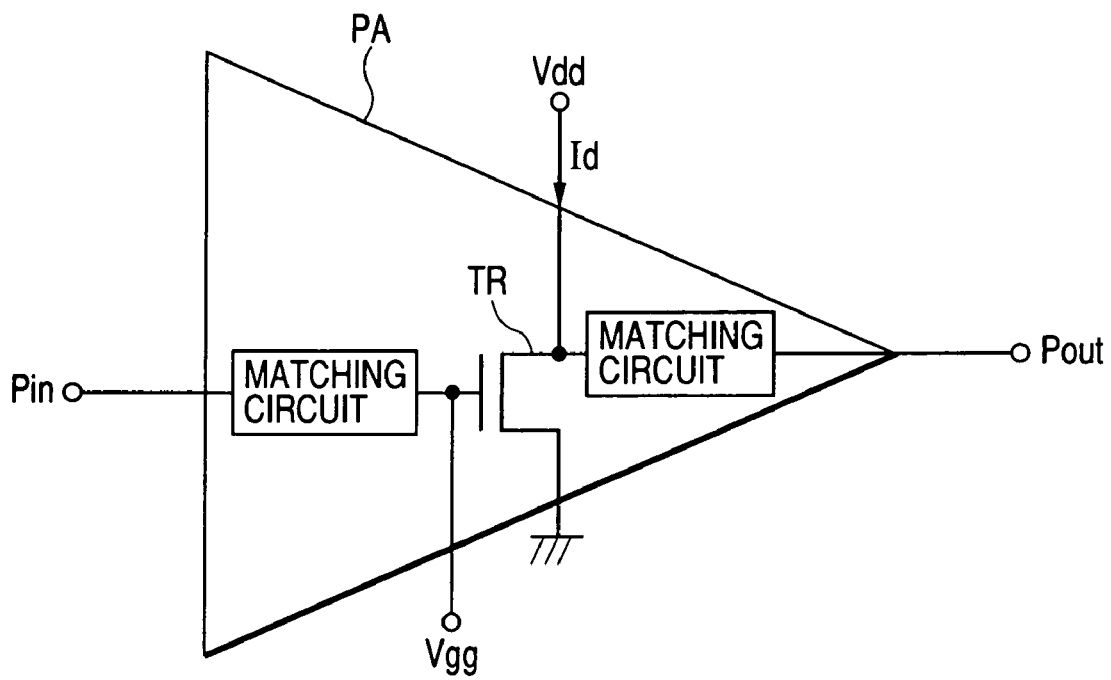
FIG. 11 is an equivalent circuit diagram of a power amplifier circuit according to the invention.
Figure 12:
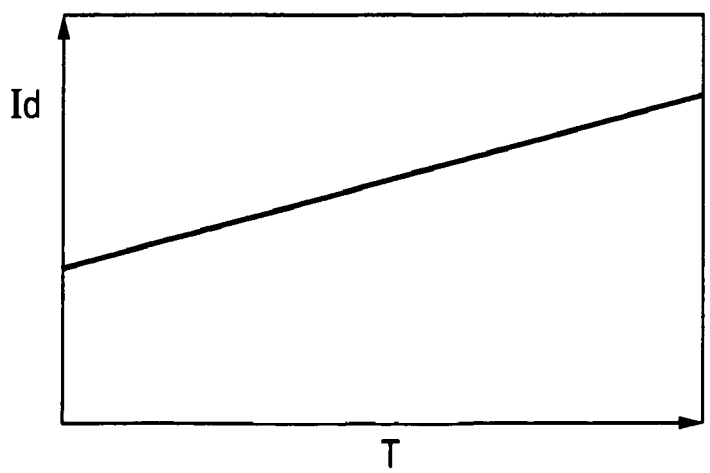
FIG. 12 is a graphic representation showing a temperature characteristic required of a current Id of the power amplifier circuit shown in FIG. 11.

FIG. 10 is a block diagram outlining a wireless communication system embodying the invention, the system being capable of wireless communication using two bands, GSM and DCS. In FIG. 10, reference character ANT stands for an antenna for transmitting and receiving radio signals. Reference character 100 denotes a single-package electronic device (RF device) comprising a high-frequency signal processing semiconductor integrated circuit (base band IC) and band pass filters BPF1, BPF2, BPF3 and BPF4. The high-frequency signal processing semiconductor integrated circuit is formed on a single semiconductor chip that includes modems providing GMSK modulation and demodulation for a GSM or DCS system, and a high-frequency signal processing circuit (base band circuit) 110 which generates I and Q signals based on transmitted data (base band signal) and processes I and Q signals extracted from received signals. The single semiconductor chip also includes low-noise amplifier circuits LNA1 and LNA2 for amplifying the transmitted signal. The band pass filters BPF1 and BPF2 remove high-frequency components from the transmitted signal, and the band pass filters BPF3 and BPF4 eliminate unnecessary radio waves from the received signal. Tx-MIX1 and Tx-MIX2 represent mixers for up-converting the transmitted signal, and Rx-MIX1 and Rx-MIX2 denote mixers for down-converting the received signal.

In FIG. 10, reference character 200 stands for a high-frequency power amplification module (called the power module hereunder) that includes on a single ceramic substrate the above-described high-frequency power amplifier circuits 210a and 210b for amplifying high-frequency signals fed from the base band IC 100, and the bias control circuit 240. Reference character 300 denotes a front-end module comprising: output detection circuits PDT1 and PDT2 made of couplers and other elements for detecting the output level of the transmitted signal to be output by the power module; an automatic power control circuit APC which, based on detection signals from the output detection circuits PDT1 and PDT2 as well as on a power control signal PCS from the base band IC 110, generates an output control signal Vapc for gain control amplifier circuits GCA1 and GCA2 in the base band IC 110; filters LPF1 and LPF2 for removing noises such as harmonic content from the transmitted signal; branching filters DPX1 and DPX2 for composing or separating GSM and DCS signals; and a changeover switch T/R-SW for providing a switch between transmission and reception.

In this embodiment, as shown in FIG. 10, the base band IC 110 in the RF device 100 supplies bias currents Icont2H and Icont2L for the last stage of the GSM power amplifier circuit 210a and DCS power amplifier circuit 210b in the power module 200. The base band IC 110 in the RF device 100 also supplies constant currents Icont1H and Icont1L which correspond to the reference Iref input to the temperature detection circuit 241 of the bias control circuit 240 shown in FIG. 2. The current Icont1H is supplied while GSM transmission mode is in effect, and the current Icont1L is provided when DCS transmission mode is in use. The currents Icont1L and Icont1L supplied by the base band IC 110 determine the gains of the power amplifier circuits 210a and 210b. Either of the two currents Icont1H and Icont1L is fed to the power module at any one time; the two currents are not supplied simultaneously.

The bias control circuit 240 of the embodiment in FIG. 2 includes a circuit, not shown, for generating a switching control signal BSC for controlling the changeover switches SW1 and SW2 indicated in the bias control circuit 240 of FIG. 6. The control signal generating circuit determines which of the currents Icont1H and Icont1L is being fed from the RF device 100, before generating the control signal BSC accordingly. Alternatively, the switching control signal BSC may be generated in accordance with a mode selection signal Vmode sent from the base band IC 110 to the bias control circuit 240. As another alternative, the switching control signal BSC for controlling the changeover switches SW1 and SW2 may be generated and supplied by the base band IC 110 or by some other component.

As can be seen in FIG. 10, this embodiment has the gains of the power amplifier circuits 210a and 210b kept constant using the current Icont1H or Icont1L supplied by the base band IC 110. In that state, the output control signal Vapc from the automatic power control circuit 120 is fed to the gain control amplifier circuits GCA1 and GCA2 in the base band IC 110, so that the output control signal Vapc controls the gains of the amplifiers GCA1 and GCA2. That in turn varies the input power to the power amplifier circuits 210a and 210b, causing their output power to vary correspondingly. Because the bias control circuit 240 for biasing the power amplifier circuits 210a and 210b has the above-described temperature compensation capability, the gains of the power amplifier circuits 210a and 210b are kept constant regardless of temperature variations and free from deviations in characteristic of the circuit elements attributable to unstable manufacturing procedures.

Although the embodiment above has its band pass filters BPF1 through BPF4 made up of capacitative and resistive elements attached externally to the base band IC, this is not limitative of the invention. Alternatively, the elements constituting the band pass filters BPF1 through BPF4 may be formed on the same semiconductor chip comprising the base band circuit 110. The devices and modules discussed above may be supplemented with a micro-processor (CPU), not shown in FIG. 10, for controlling the system as a whole by generating a control signal for the RF device 100 and an output level designation signal serving as a basis for generating the power control signal PCS.

Although the description above contains many specificities, these should not be construed as limiting the scope of the invention but as merely providing illustrations of some of the presently preferred embodiments of this invention. It is to be understood that changes and variations may be made without departing from the spirit or scope of the claims that follow. For example, although the bias generation circuit 242 of FIG. 6 was shown having the MOSFETs Q11 through Q14 and Q21 through Q24 connected to the output transistors of the amplifier circuits AMP1 and AMP2 to form a current mirror circuit, this is not limitative of the invention. Alternatively, there may be provided an ordinary differential amplifier circuit, an MOSFET that receives the differential amplifier output, and a resistor connected to the drain of the MOSFET which may in turn be connected to the MOSFETs Q11 through Q14 and Q21 through Q24 to form a current mirror circuit.

In the high-frequency power amplification circuit shown practiced above, the power amplification FETs are furnished in three stages. Alternatively, two stages or four stages or more of the transistors may be installed. As another alternative, the second or third stage FETs may be formed by a pair of parallelly connected FETs in the applicable stage. Whereas the high-frequency power amplification block and the front end block for the embodiments above were described as separate modules 200 and 300, these blocks may be formed alternatively in a single module.

The invention has been described as applicable primarily to the power module as part of a dual mode wireless communication system capable of transmission and reception in two communication modes, GSM and DCS, i.e., the field of utilization constituting the technical background of the inventors. However, this is not limitative of the invention. Alternatively, the invention may apply as well to power modules constituting part of wireless communication systems such as mobile telephones operating in GSM or DCS mode capable of GSMK modulation or EDGE modulation, to CDMA (code division multiple access) mobile telephones, and multi-mode mobile telephones capable of communicating in three or more communication modes including GMS, CDS, and PCS (personal communication system).

The major benefits of the invention disclosed above are summarized as follows: according to the invention, there is provided a bias control circuit for generating a bias current or a bias voltage for a power amplifier circuit arranged to control output power in accordance with input power that is varied while the power amplifier gain is being fixed by biasing. The bias control circuit generates the bias current or voltage having a necessary temperature characteristic dependent on the characteristic of the power amplification transistors in each of the stages constituting the power amplifier circuit, and supplies the generated bias current or voltage to the power amplifier circuit. The structure keeps the power amplifier gain constant regardless of temperature variations. This contributes to suppressing the growing noises from the power amplifier circuit at high temperatures and averting the power loss attributable to an inordinately low power amplifier gain at low temperatures.

What is claimed is:

1. A high-frequency power amplification electronic component comprising:
    a power amplifier circuit which has a plurality of amplifier stages for amplifying an input signal; and
    a bias control circuit which generates bias voltages or bias current to the power amplifier circuit;
    wherein the bias control circuit includes two or more diode characteristic elements which supply predetermined currents and generate two or more voltages having different temperature characteristics from each other, and which generate the bias voltages or the bias currents having different temperature characteristics from each other.

2. A high-frequency power amplification electronic component according to claim 1, wherein the bias control circuit generates the bias currents or the bias voltages having different temperature characteristics based on a reference current.

3. A high-frequency power amplification electronic component according to claim 1, wherein the two or more diode characteristic elements are arranged in parallel, and receive the predetermined currents different from each other.

4. A high-frequency power amplification electronic component according to claim 1, wherein the predetermined currents are generated by current mirror circuits according to the reference current.

5. A high-frequency power amplification electronic component according to claim 3, wherein the bias control circuit comprises:
    an error amplifier circuit coupled with the diode characteristic elements and which amplifies a first signal and a second signal according to an output of the diode characteristic elements;
    a first amplifier circuit which converts output voltage of the error amplifier circuit into current;
    a first transistor group which includes a plurality of transistors coupled to an output transistor of the first amplifier circuit or a transistor receiving an output of the first amplifier circuit for forming current mirroring purposes;
    a second amplifier circuit which receives a reference voltage and converts the reference voltage into current; and
    a second transistor group which includes a plurality of transistors coupled with an output transistor of the second amplifier circuit or a transistor receiving an output of the second amplifier circuit for forming current mirroring purpose,
    wherein the bias currents or the bias voltages generated by subtracting from the currents of the transistors constituting the first transistor group, the currents of the corresponding transistors constituting the second transistor group, or the bias voltages converted from the currents.

6. A high-frequency power amplification electronic component according to claim 4, further comprising:
   first switching means arranged between the output transistor of the first amplifier circuit or the transistor receiving the output of the first amplifier circuit, and the first transistor group, the first switching means enabling or disabling the input either to the output transistor of the first amplifier circuit or to the transistor receiving the output of the first amplifier circuit; and
   second switching means arranged between the output transistor of the second amplifier circuit or the transistor receiving the output of the second amplifier circuit, and the second transistor group, the second switching means enabling or disabling the input either to the output transistor of the second amplifier circuit or to the transistor receiving the output of the second amplifier circuit.

7. A high-frequency power amplification electronic component according to claim 6, which further includes buffer circuits arranged between the error amplifier circuit and the diode characteristic elements, and the buffer circuit converts output of the diode characteristic elements to the first signal and the second signal.

8. A high-frequency power amplification electronic component according to claim 1, further comprising:
   a first high-frequency power amplifier circuit for amplifying an outgoing signal on a first frequency band and outputting the amplified signal; and
   a second high-frequency power amplifier circuit for amplifying an outgoing signal on a second frequency band and outputting the amplified signal,
wherein the bias control circuit generates the bias currents or the bias voltages for both of the first high-frequency power amplifier circuit and the second high-frequency power amplifier circuit.

9. A wireless communication system comprising:
a high-frequency power amplification electronic component according to claim 1;
a second electronic component which has a variable gain amplifier circuit for amplifying an outgoing signal and which inputs the signal modulated by the variable gain amplifier circuit to the high-frequency power amplification electronic component; and
a third electronic component which includes:
   level detecting means for detecting an output level of the outgoing signal output by the high-frequency power amplification electronic part; and
   a control circuit which, based on a detection signal coming from the level detecting means and a signal designating the output level, generates an output control signal for controlling the gain of the variable gain amplifier circuit, the control circuit further supplying the generated output control signal to the second electronic component.

* * * * *